United States Patent [19]

Mollenstedt

[11] Patent Number: 5,045,705
[45] Date of Patent: Sep. 3, 1991

[54] CHARGED PARTICLE BEAM APPARATUS WITH CHARGE-UP COMPENSATION

[75] Inventor: Gottfried Mollenstedt, Tübingen, Fed. Rep. of Germany

[73] Assignee: U.S. Philips Corp., New York, N.Y.

[21] Appl. No.: 579,910

[22] Filed: Sep. 10, 1990

[30] Foreign Application Priority Data

Sep. 15, 1989 [EP] European Pat. Off. ........... 89202328

[51] Int. Cl.⁵ ............................................. H01J 37/26
[52] U.S. Cl. .......................... 250/398; 250/396 ML; 250/396 R; 250/311
[58] Field of Search ........... 250/398, 396 ML, 396 R, 250/311, 251, 310, 492.2

[56] References Cited

U.S. PATENT DOCUMENTS

| | | | |
|---|---|---|---|
| 2,890,342 | 6/1959 | Columbe | 250/398 |
| 3,731,094 | 5/1973 | Le Poole | 250/396 R |
| 4,209,698 | 6/1980 | Hoppe | 250/311 |
| 4,303,930 | 12/1981 | Van Gorkom et al. | 357/13 |
| 4,306,149 | 12/1981 | Le Poole et al. | 250/311 |
| 4,820,898 | 4/1989 | Slingerland | 250/251 |
| 4,939,360 | 7/1990 | Sakai | 250/398 |

Primary Examiner—Jack I. Berman
Assistant Examiner—Kiet T. Nguyen
Attorney, Agent, or Firm—William L. Botjer

[57] ABSTRACT

A charged particle beam apparatus comprising a particle source for generating a particle beam to irradiate a specimen located in a field space of a particle lens of the apparatus is provided with an auxiliary particle source for generating a particle beam of low energy particle to be injected into the lens field space and to be directed to the surface of the specimen by the same lens field.

5 Claims, 1 Drawing Sheet

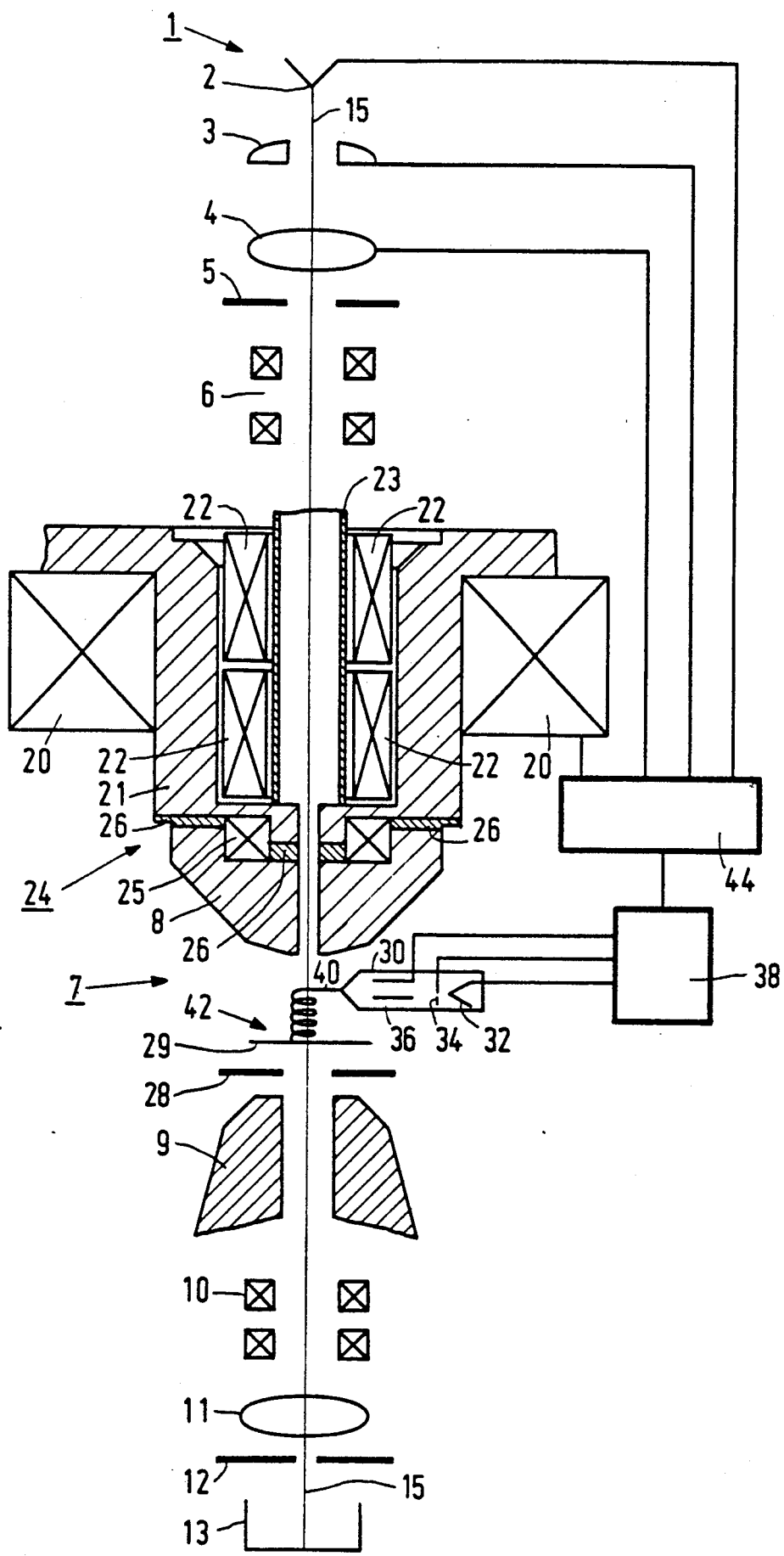

CHARGED PARTICLE BEAM APPARATUS WITH CHARGE-UP COMPENSATION

BACKGROUND OF THE INVENTION

The invention relates to a charged particle apparatus comprising a particle source for generating a particle beam irradiating a specimen to be located in the lens field space of a lens which forms part of a charged particle lens system of the apparatus.

Such an apparatus in the shape of an electron beam apparatus is known from U.S. Pat. No. 4,306,149. This document discloses an electron microscope in which an object is located in a lens field space of an objective lens. This lens is provided with an auxiliary lens to enable easy switching between different modes of operation. In U.S. Pat. No. 4,820,898 an ion beam apparatus for which the invention is applicable is disclosed.

If in such an apparatus electrically non-conductive specimens are examined the specimen may be charged up. This charging-up of the specimen may result in additional electric fields in the volume around the specimen which may have adverse effects on the imaging properties of the objective lens and hence on the image quality. This drawback has been neglected or accepted in the past because due to the moderate vacuum in the apparatus it rapidly vanished as a consequence of contamination on the surface of the specimen. The surface becomes electrically conductive, and the charging-up vanishes. No possibility of avoiding contamination apart from heating up the specimen is known. Unfortunately carbon deposits on the specimen surface are also liable to impair the image quality oz to detoriate right landing positions in a beam writing system such an electron beam pattern generator or ion beam implantating apparatus.

In more modern instruments in which a relatively high vacuum can be realized which is necessity for studies of biological specimens etc., no substantial contamination occurs, and the phenomena of charging-up occur with all their drawbacks.

One known method of neutralizing the specimen charge consists in producing slow charged particles of opposite sign from an auxiliary electron or ion source The slow charged particles will then be attracted to the specimen by the electrostatic field of the specimen charge and thus neutralize it. This method is, however, not applicable if the specimen is located in a region with a strong magnetic field because, according to Busch theorem, slow particles cannot enter a strong magnetic field unless they start from the auxiliary source with specific initial conditions giving them corresponding initial values of the angular momentum about the optical axis. If the value of the angular momentum of a charged particle is outside a certain limited range of values, then the particle is rejected by a strong magnetic field ("magnetic mirror"). This restriction of the range of initial values of the angular momentum of the charged particles emitted from an auxiliary source is of great practical importance if the charged particles are electrons. On the other hand, if the charged particles are ions, then they can, due to their large mass, reach the specimen with almost any practically realizable value of their initial angular momentum. A neutralization of the specimen charge by ions would, however, have the drawback that their presence would change the composition of the specimen to be examined.

SUMMARY OF THE INVENTION

The invention aims at neutralizing the specimen charge using an auxiliary charged particle placed close to the lens field space in which the specimen is located. According to the invention, the electrical and geometrical parameters of the auxiliary particle source are chosen to give the relatively slow particles initial velocities and directions enabling them to be directed to the specimen surface across the magnetic lens field.

Since the charging-up phenomena are mainly generated by secondary electron emission from the specimen upon impinging of the relatievely highly energetic primary electrons from the main electron beam, the specimen charge has preferentially positive sign. Thus the invention provides means for the generation of electrons to be directed to the specimen surface in order to compensate for the loss of electrons due to secondary emission. Using an auxiliary electron source which injects electron into the local magnetic lens field in such a manner that they are guided to the specimen and stay there, the charge-up can he fully neutralized. It would also be possible to use secondary electrons from an objective diaphragm from which secondary electrons are released by a part of the main electron beam impinging thereupon. This method, however, has the drawback that the geometrical shape of the apparatus in a vital region would have to be adapted thereto. The necessity of such an adaptation should be avoided because it might strongly limit the field of view on the specimen in most modes of examination.

In a preferred embodiment the objective lens field itself is used to guide an electron beam from the auxiliary electron source onto the specimen. In order to achieve this, the values of the initial velocities and initial directions of the slow electrons from the auxiliary source must lie within specific intervals in order to prevent the magnetic mirror effect. If the initial conditions are correctly chosen, then the electrons will move along spiral trajectories around the magnetic field lines, and the flood beam formed by such electrons may cover the whole area of the specimen under examination. The operational parameters of the auxiliary electron source can also be adapted, using a control system, to relevant properties of the main electron beam such as the current value thereof and to secondary properties of the specimen if known.

In a further embodiment the secondary electron source is an electron emitter of any kind for example a p-n electron emitter such as disclosed in U.S. Pat. No. 4,303,930 provided with additional electron-optical means to control the initial directions and initial energies of the electrons in the auxiliary electron beam, and with control means for its current.

In an embodiment for local field neutralization the auxiliary electron gun can he provided with a scanning system coupled with the scanning system for the main beam in order to inject the neutralizing auxiliary particle beam which is now focused into a crossover on the momentary impinging point of the main beam.

BRIEF DESCRIPTION OF THE DRAWING

Some embodiments of the invention will now be described by way of example with reference to the drawing. The sole Figure of the drawing shows schematically a longitudinal section view of an electron microscope embodying the invention.

DETAILED DESCRIPTION OF THE PREFERRED EMBODIMENT

An electron microscope as shown in the Figure comprises an electron source 1 with an electron emitter 2 and an anode 3, a condensor system 4 with a condensor aperture 5, a pre-specimen beam deflection system 6, an objective lens system 7 with a first pole piece 8 and a second pole piece 9, a post-specimen deflection system 10, a magnifying lens system 11, a differential pump aperture 12 and a detection system for operation as a scanning transmission electron microscope (STEM). All elements are arranged around an electron beam 15 to be generated by the electron gun, and being indicated as the main electron beam. The first pole piece 8 of the objective lens system 7 comprises a coil 20, a yoke 21, scanning coils 22, a vacuum tube 23 and an auxiliary lens system 24 for which a coil 25 as well as a gap 26 in the ferromagnetic yoke are indicated.

The second pole piece 9 is normally substantially similar to pole piece 8 apart from the deflection coil system and the auxiliary lens which may, however, also be introduced in the second pole piece. In front of the second pole piece an objective aperture 28 is positioned which aperture normally is removable and interchangeable in size. Between the two pole pieces a specimen 29 to be examined is positioned.

As already indicated in some modes of operation the possibility exists to generate secondary electrons from the aperture 28 by the main beam Under certain conditions these secondary electrons can be collected by the specimen in order to neutralize the charging-up. The apparatus further comprises an auxiliary electron source 30 in the shape of an electron gun with an electron emitter 32, an anode 34, and an electron-optical beam focussing system 36. Such an auxiliary gun is described in U.S. Pat. No. 3,731,094 for example and is used there to neutralize space-charge phenomena. Relevant elements of the auxiliary gun are connected to a control unit 38 for controlling an auxiliary electron beam 40 to be injected into an objective lens field area 42. The control unit 38 for controlling an auxiliary electron beam 40 to be injected into an objective lens field area 42. The control unit 38 is linked to a control unit 44 which controls the main electron beam such that parameters for the main beam can be introduced into the control system for the auxiliary beam and if appropriate vice versa. The auxiliary electron beam in general is adapted to the lens field of the objective lens such that it will be guided thereby to the specimen, irradiating a whole relevant area of the specimen with electrons which have a velocity small enough to cause no substantial secondary emission but will be absorbed in the specimen as long as this is positively charged up. Due to local fields near to the specimen as a consequence of local charging-up phenomena the electrons of the auxiliary beam will move to locations with the highest potential. These locations will thus become neutralized. If appropriate the electron source can be incorporated in part of the yoke of the objective lens.

I claim:

1. A charged particle beam apparatus comprising a particle source for generating a particle beam to irradiate a specimen located in a lens field space of a lens which forms part of a charged particle lens system for the particle beam apparatus, characterized in that near to the lens field space there is provided an auxiliary particle source for generating a particle beam of relatively low energy particles to be injected into the lens field space and to be directed to the surface of the specimen by the same field as used for a main particle beam.

2. Charged particle beam apparatus as claimed in claim 1, characterized in that the particle beam of the auxiliary particle source is guided along spiral shaped trajectoreis enclosing the magnetic field lines onto the surface of a specimen positioned in an objective lens field space.

3. Charged particle beam apparatus as claimed in claim 1 characterized in that a control system is provided to control the auxiliary particle beam in relation to the main particle beam.

4. Charged particle beam apparatus as claimed in claim 1, characterized in that a control system for an auxiliary particle beam is fed with information related to secondary emission properties of the specimen to be examined.

5. Charged particle beam apparatus as claimed in claim 1 characterized in that the auxiliary particle source is constituted as a particle gun provided with a particle emitter, an anode, and a beam controlling system.

* * * * *